United States Patent [19]

Canestaro

[11] Patent Number: 5,762,082
[45] Date of Patent: Jun. 9, 1998

[54] PRECISION FLUID HEAD TRANSPORT

[75] Inventor: Michael James Canestaro, Endicott, N.Y.

[73] Assignee: International Business Machines Corporation, Armonk, N.Y.

[21] Appl. No.: 627,553

[22] Filed: Apr. 4, 1996

Related U.S. Application Data

[62] Division of Ser. No. 483,581, Jun. 7, 1995.

[51] Int. Cl.⁶ ........................................... B08B 3/04
[52] U.S. Cl. ...................... 134/64 R; 134/122 R; 134/199; 134/902
[58] Field of Search ................. 134/64 R, 122 R, 134/199, 902, 133, 155, 186; 198/500

[56] References Cited

U.S. PATENT DOCUMENTS

| | | | |
|---|---|---|---|
| 3,885,581 | 5/1975 | Dahan et al. | 134/199 |
| 4,098,495 | 7/1978 | Lhenry et al. | 134/199 |
| 4,185,649 | 1/1980 | Germain | 134/122 R |
| 4,209,345 | 6/1980 | Germain | 134/122 R |
| 4,408,560 | 10/1983 | Caratsch | |
| 4,541,141 | 9/1985 | le Goff | |
| 4,577,949 | 3/1986 | Geyken et al. | 134/122 R |
| 4,723,562 | 2/1988 | Wilmotte et al. | 134/199 |
| 4,877,111 | 10/1989 | Kipler | 198/500 |
| 4,938,257 | 7/1990 | Morris | 134/199 |
| 5,051,136 | 9/1991 | Tuominen | |
| 5,129,956 | 7/1992 | Pickering et al. | |
| 5,220,935 | 6/1993 | Bailey et al. | |
| 5,263,504 | 11/1993 | Bailey et al. | |
| 5,483,984 | 1/1996 | Donlan, Jr. et al. | 134/199 |
| 5,529,081 | 6/1996 | Kappler | 134/199 |

*Primary Examiner*—Frankie L. Stinson
*Attorney, Agent, or Firm*—Pollock, Vande Sande & Priddy

[57] ABSTRACT

A fluid treatment apparatus, including a lower substrate transportation and fluid head including a plurality of lower drive rod members provided in a plurality of spaced apart lower drive rod member receiving passages. The lower drive rod members at least partially extend through an upper surface of the lower substrate transportation and fluid head. A plurality of fluid injector passages and fluid drain passages are provided between the lower drive rod members. An upper substrate transportation and fluid head is provided including a plurality of upper drive rod members provided in a plurality of spaced apart drive upper rod member receiving passages. The upper drive rod members at least partially extending through a lower surface of the upper substrate transportation and fluid head. A plurality of fluid injector passages and fluid drain passages are provided between the upper drive rod members. A fluid supply apparatus supplies fluid to the fluid injector passages. A fluid source supplies fluid to the fluid treatment apparatus.

26 Claims, 4 Drawing Sheets

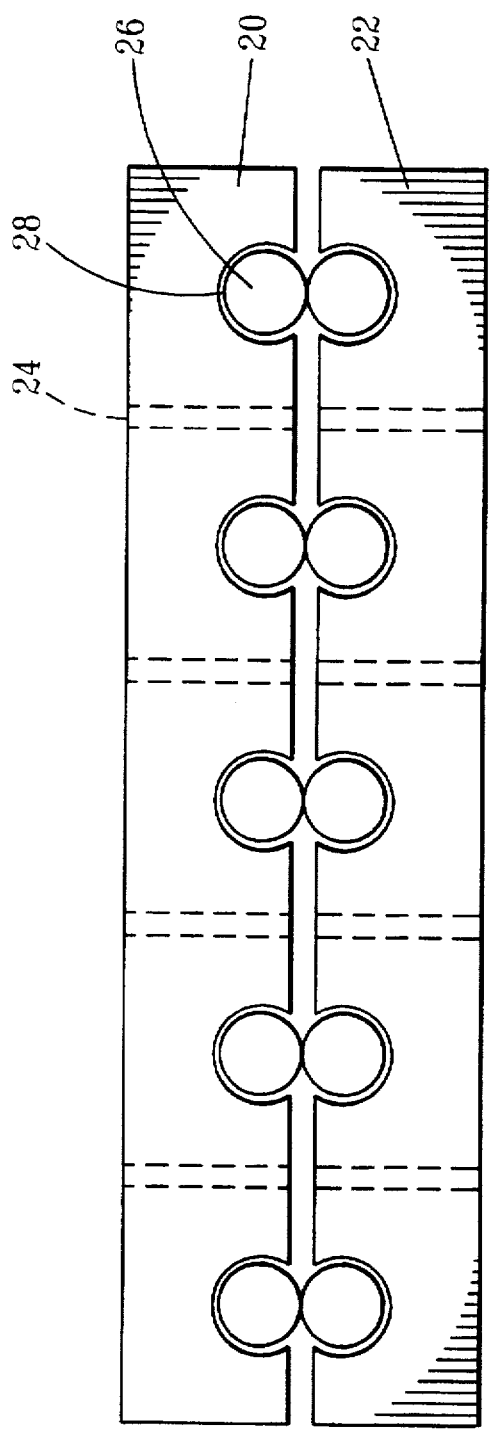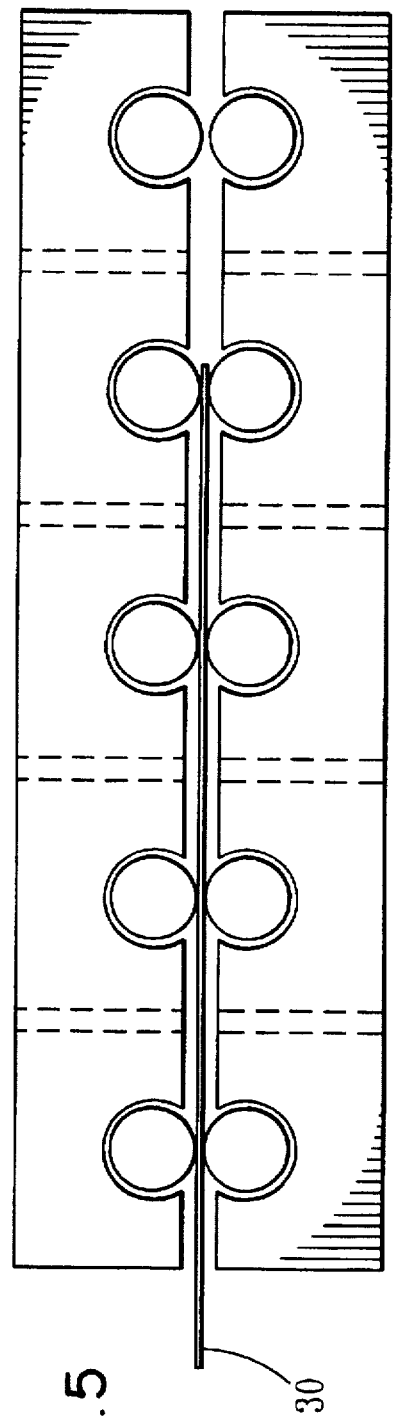

PRECISION FLUID HEAD TRANSPORT

This application is a Divisional of U.S. patent application Ser. No. 08/483,581, filed Jun. 7, 1995 still pending.

FIELD OF THE INVENTION

The invention relates to devices for treating substrates, such as electronic components, for example, printed circuit boards, with one or more treatment fluid. Also, the invention relates to devices for transporting substrates through fluid treatment devices. The invention also relates to methods of making fluid treatment devices and methods of treating substrates with fluid treatment devices and transporting the substrates through fluid treatment devices.

BACKGROUND OF THE INVENTION

The use of fluid to perform various functions in the manufacturing and processing of electronic components, such as printed circuit boards, is well known. For instance, fluids are used to etch away certain portions of and also to clean multi-layer circuit boards, for example. The fluid treatment of electronic components, such as printed circuit boards, often involves immersing the components in the treatment fluid. The purposes or the treatment fluid may vary, depending upon the application involved.

Fluid treatment devices used for processing electronic components typically include means for directing one or more streams of one or more treatment fluids against one or more surfaces of a substrate. With many treatment devices of this type, the substrate being treated by the treatment fluid passes between two fluid heads or at least one fluid head and a substrate support. The fluid head directs the treatment fluid toward the substrate and drains fluid away from the substrate.

In order for the fluid treatment apparatus to effectively treat an entire surface area of a substrate, it is often desirable for the treatment fluid to act on the substrate with a certain velocity. Maintaining this velocity may be especially difficult within passages formed in the interior of the substrate, such as plated through holes and vias in a printed circuit board. Establishing and maintaining a desired velocity of the treatment fluid may be aided by reducing the distance between a surface of the substrate being treated and the surface of the fluid treatment apparatus.

Often, substrates with a lesser thickness are not as effectively treated by fluid treatment apparatuses designed to treat thicker substrates. If no way exists to confine the treatment fluid to the substrate, treating passages formed in the substrate may be especially difficult because the fluid will only flow through the passages through the action of the inertia of the fluid.

SUMMARY OF THE INVENTION

The inventors of the present invention recognized the above problems and others present in the art and developed the present invention to address these and other problems.

Accordingly, an object of the present invention is to provide a combined fluid treatment and substrate transport apparatus.

Also an object of the present invention is to provide a fluid treatment apparatus effective for treating thinner substrates.

Another object of the present invention is to provide a provide a fluid treatment apparatus capable of generating effective fluid treatment pressures on all surfaces of a substrate being treated.

A further object of the present invention is to provide a fluid treatment apparatus including a substrate transport mechanism that takes up relatively little real estate of the fluid treatment apparatus.

An additional object of the present invention is to provide a simple fluid treatment apparatus having few moving parts.

It is also an object of the present invention to provide a fluid treatment apparatus that is easy to maintain.

A further additional object of the present invention is to provide a fluid treatment and substrate transportation apparatus that includes few, if any locations for movement of a substrate being treated to be impeded by parts of the fluid treatment and/or substrate transportation apparatus.

In accordance with these and other objects and advantages, preferred aspects of the present invention provide a fluid treatment apparatus, including a lower substrate transportation and fluid head including a plurality of lower drive rod members provided in a plurality of spaced apart lower drive rod member receiving passages. The lower drive rod members at least partially extend through an upper surface of the lower substrate transportation and fluid head. A plurality of fluid flow passages are provided between the lower drive rod member receiving passages. An upper substrate transportation and fluid head is provided including a plurality of upper drive rod members arranged in a plurality of spaced apart drive upper rod member receiving passages. The upper drive rod members at least partially extend through a lower surface of the upper substrate transportation and fluid head. A plurality of fluid injector passages and fluid drain passages are provided between the upper drive rod members. A fluid supply apparatus supplies fluid to the fluid injector passages. A fluid source supplies fluid to the fluid treatment apparatus.

According to other preferred aspects, the present invention provides a method of treating a substrate. The method includes the step of providing a fluid treatment apparatus including a lower substrate transportation and fluid head including a plurality of lower drive rod members provided in a plurality of spaced apart lower drive rod member receiving passages. The lower drive rod members at least partially extend through an upper surface of the lower substrate transportation and fluid head. A plurality of fluid flow passages are provided between the lower drive rod members. The fluid treatment apparatus also includes an upper substrate transportation and fluid head including a plurality of upper drive rod members provided in a plurality of spaced apart drive upper rod member receiving passages. The upper drive rod members at least partially extend through a lower surface of the upper substrate transportation and fluid head. A plurality of fluid flow passages are provided between the upper drive rod members. The fluid treatment apparatus also includes a fluid supply apparatus for supplying fluid to the fluid injector passages and a fluid source. The method also includes the steps of causing a substrate to be treated to pass between the upper and lower substrate transportation and fluid heads and causing a fluid to flow through the fluid injector passages.

According to further preferred aspects, the present invention provides a method of forming a fluid treatment apparatus. The method includes the step of providing a first sheet of material, having an upper surface and a lower surface. A plurality of drive rod member receiving passages are provided in the first sheet of material. An inside surface of each of the drive rod member receiving passages is continuous with the upper surface of the first sheet. A plurality of fluid flow passages are provided in the first sheet between the drive rod member receiving passages. A drive rod member is inserted into each of the drive rod member receiving passages in the first sheet. A second sheet of material having an upper surface and a lower surface is also provided. A plurality of drive rod member receiving passages are provided in the second sheet of material. An inside surface of each of the drive rod member receiving passages is continuous with the lower surface of the second sheet. A plurality of fluid flow passages are provided in the second sheet between the drive rod member receiving passages. A drive rod member is inserted into each of the drive rod member receiving passages in the second sheet. The second sheet is arranged over the first sheet, such that the drive rod members face each other.

Each embodiment of the present invention may be equipped with one or more of the above objects and advantages. Still other objects and advantages of the present invention will become readily apparent those skilled in this art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

FIG. 4 represents a cross-sectional view of an embodiment of the present invention in a resting state, at a time when a substrate is not being treated; and FIG. 5 represent a cross-sectional view of the embodiment of the invention shown in FIG. 4 with a substrate being treated in the apparatus.

DETAILED DESCRIPTION OF VARIOUS AND PREFERRED EMBODIMENTS OF THE INVENTION

The present invention is a precision fluid head transport. The invention is useful for treating substrates with a fluid. In particular, the invention is useful for treating planar substrates, especially circuit boards and other similar electronic devices.

Accordingly, the present invention provides devices for treating substrates and transporting the substrates through the treatment apparatus. The invention provides a variety of improvements over known fluid treatment and transport apparatuses. Among these advantages are the capability to treat relatively thin substrates. For example, substrates as thin as about 0.5 mil and even thinner, can be effectively treated and transported by the present invention.

As advances in design and construction techniques progress, device size has decreased. This is one reason that substrate thickness has decreased. Typically, thinner substrates are treated with conventional fluid treatment techniques and apparatuses to process them.

Whether the substrates being treated are thin or thick, an important aspect of the treatment is ensuring an adequate flow of treatment fluid over substantially all surfaces of the substrate. With thin substrates, this can become a problem if the substrate is too thin for the treatment device in that the surface of the substrate is too great a distance to ensure adequate fluid flow and/or pressure over the surface of the substrate. The fluid may flow away from and/or around the circuit board.

The problem of maintaining fluid flow over the surface of a circuit board may increase in importance if the substrate is a printed circuit board that includes through holes, vias, and/or other passages. If such a circuit board is separated from the fluid treatment apparatus by too great a distance, then fluid flowing away from and around the board will not be flowing into the passages in the circuit board. In such cases, inertia of the fluid alone may be the only force directing the fluid into the passages. In such cases, the treatment of the substrate may be uneven, leaving some areas untreated or undertreated.

Another issue in fluid treatment and substrate transport devices is the amount of space available for the substrate transport mechanism and the fluid treatment apparatus. Often, the substrate transport mechanism takes up a great deal of space, compromising the space available for the fluid treatment components of the device. Known fluid treatment and substrate transport devices are also typically quite complex.

The present invention was developed with these and other problems in mind. The solution to these and other problems that the present invention provides, as well as other advantages of the invention will be described in detail below.

Figure 1:
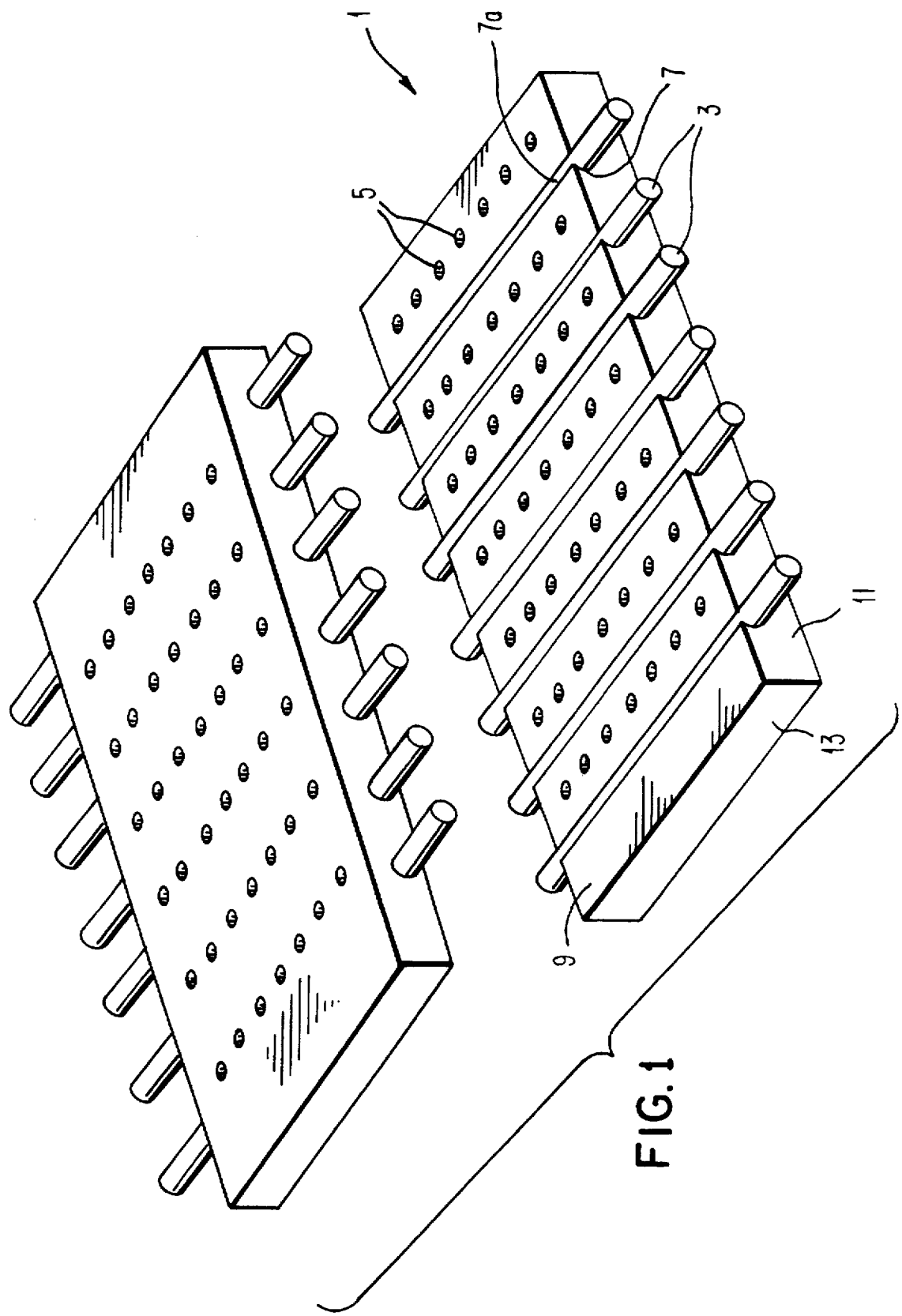
FIG. 1 represents a perspective view of one embodiment of a fluid head transport according to the present invention.

FIG. 1 shows one embodiment of a precision fluid head transport according to the present invention. As shown in FIG. 1, the invention has components directed to two primary functions. The first function is related to treating a substrate with a treatment fluid. The second function is associated with transporting a substrate through the fluid treatment apparatus.

A fluid treatment apparatus according to the present invention includes a plate 1. The plate may also be known as a substrate transportation and fluid head. The plate has a surface 7 that will be adjacent a substrate being treated. In the plate 1 shown in FIG. 1, this is the upper surface of the plate. The plate 1 also includes a surface (not shown in FIG. 1) opposite the surface 7. The plate includes two side surfaces 11 (the other not shown in FIG. 1). A front surface 13 is the end of the plate that will be upstream of substrates moving over the device. On the other hand, a rear surface (not shown in FIG. 1) is on the downstream side of the plate, opposite the front surface.

As can be appreciated from the above description, the designation of a surface as a front or rear surface depends upon the movement of the substrate through the apparatus. Therefore, the designation as front or rear surface may vary. Accordingly, the designation herein are for convenience and clarity and are not restrictive.

The plate may be formed in a variety of sizes, depending upon the size of the substrate the is desired to be treated. Other factors may also enter into the equation for determining the size of the plate 1, such as the fluid pressure to be maintained and the size of the drive rod members, among others. The size of the plate in typical embodiments may be from about 4 inches to about 12 inches by about 12 inches to about 36 inches and have a thickness of from about 0.5 inch to about 1 inch. The effective size of the device may be increased by placing plates end-to-end or side-to-side, as described below in greater detail.

In one embodiment, the plate is about six inches wide by about twenty-four inches long. In this embodiment, the plate starts out about one inch thick. However, as described below, in the process of forming this embodiment, a portion of one of the surfaces of the plate is removed to expose the drive rod member receiving passages. Of course, the plate may be formed in any desired size.

The surface area of the surface of the plate exposed to the substrate, surface 7 in the embodiment shown in FIG. 1, may be increased, thereby increasing the effective treatment area, by joining together a plurality of plates. For example, plates may be arranged side-by-side or end-to-end to increase the effective treatment area. In addition, a plurality of plates may be joined to treat a plurality of substrates simultaneously or sequentially. Joining together a plurality of plates, or treatment apparatuses, is discussed in greater detail below.

The plate may be formed from a variety of materials. For example, plastic could be used to form the plate. Also, metal could be used to form the plate. Additionally, composite materials or any other suitable material could be used to form the plate. In some embodiments, the plate may be formed from a flexible material. This could provide operational advantages as described in greater detail below. Considerations could be given to whether the material will be degraded by the treatment fluid and the longevity of the material in regards to the wear by the drive rod members as described below.

Regardless of the material used to form the plate, or the size of the plate, or any other factors, the plate may be formed as a unit, or cut from a larger piece of the material being used. Further treatment, such as applying a surface coating may also be performed on the plate material. For example, a surface treatment could be applied to the plate material to help it withstand the treatment fluid. Also, the surface of the drive rod member receiving passages could be coated to enhance the performance of the drive rod members or protect it as well.

The plate includes components for transporting and treating a substrate. The transportation of the substrate is accomplished by a plurality of drive rod members 3. The drive rod members may be a single member or may be comprised of a plurality of members. For example, the drive rod members may include an axle with a plurality of roller members secured thereto. The drive rod members may also not be cylindrically shaped over their entire surface.

The drive rod members may be formed from a variety of materials. For example, the drive rod members may be formed from plastic, metal, composite materials, or any other suitable material. Also, the surface of the drive rod members may be treated or coated with another material to enhance the performance of the drive rod members. For example, the surface of the drive rod members could be coated with a fluoropolymer, such as a polytetrafluoroethylene (PTFE), to enhance the rotation of the drive rod members. One polytetrafluoroethylene that may be employed is TEFLON.

The length of the drive rod members may vary. In typical embodiments, the drive rod members may vary from about 8 inches to about 48 inches in length. However, the drive rod members may be larger or smaller if desired. Additionally, the drive members, regardless of their length, may simultaneously extend through drive rod member receiving passages in more than one plate in embodiments of the invention that include a plurality of plates arranged side-by-side. The length of the drive rod members may depend at least in part upon the width of the plate(s).

In the embodiment shown in FIG. 1, the drive rod members 3 extend beyond both side surface of the plate 1. However, the drive rod members may be narrower than the plate. In such an embodiment, the drive rod members may, have a drive mechanism attached to the rod that eliminates the necessity of the rod itself extending beyond the side surfaces of the plate.

The diameter of the drive rod members may also vary. For example, the diameter may vary from about one-eighth of an inch to about three-eighths of an inch. The diameter may depend, at least in part, upon the size of the substrate being treated, the number of drive rod members, and the thickness of the plate, among other factors. For example, a substrate could be supported by a larger number of smaller diameter drive rod members or a smaller number of larger diameter drive rod members. Any combination of number of drive rod members and drive rod member diameters could be used to support and transport a substrate.

With other embodiments, only one end of the drive rod members may extend beyond one side surface of the plate. Additionally, if a treatment device according to the invention were oriented side-by-side, the drive rod members may extend only to the edge of the side surface, thereby enabling the plates to be placed in direct contact. In the embodiment described above in which the plate is about six by about twenty-four inches, the drive rod members may be about eight inches long and, therefore, would extend about one inch beyond each side surface of the plate.

As shown in FIG. 1, the drive rod members 3 preferably are substantially cylindrical. In other embodiments, at least a portion of the drive rod members acting upon the surface of the drive rod member receiving passages is cylindrical.

Although the surface of the drive rod members shown in FIG. 1 is substantially the same over the entire length of the drive rod members, the drive rod members may not have a uniform surface. For example, the portion of the drive rod members housed within the drive rod member receiving passages 7 may be discontinuous, such as if it were a series of rollers, whether the drive rod member is comprised of one or more elements. The surface may be discontinuous whether the drive rod members are a single member or a plurality of members joined together. The drive rod members could also include striations in a variety of directions on the rods. Such striations could make the drive rod members more effectively transport the substrate being treated.

Portions of the drive rod members between the cylindrical portions that would make contact with a substrate in such an embodiment could be noncylindrical. Additionally, the portion of the drive rod members in the vicinity of the ends of the drive rod members, particularly the portions of the drive rod members extending beyond the side surface(s) of the plate, could also be noncylindrical. Regardless of the exact shape of the drive rod members, a consideration in their shape is maintaining sufficient contact area between the substrate and the drive rod members to ensure support of the drive rod members and ensure sufficient friction between the drive rod members and the substrate to ensure that the substrate will be transported through the device.

At least one of the drive rod members preferably is provided with apparatus for rotating the drive rod member. For example, a motor could be attached to at least one of the drive rod members. Preferably, a number of the drive rod members sufficient to ensure that a substrate will be transported the entire length of the treatment apparatus will be provided with apparatus for effecting the rotation of the drive rod member(s). In any embodiment in which more than one drive rod member is provided with apparatus for rotating the drive rod member, each drive rod member could include such apparatus. Alternatively, some number less than all of the drive rod members could be rotationally driven.

Figure 2:
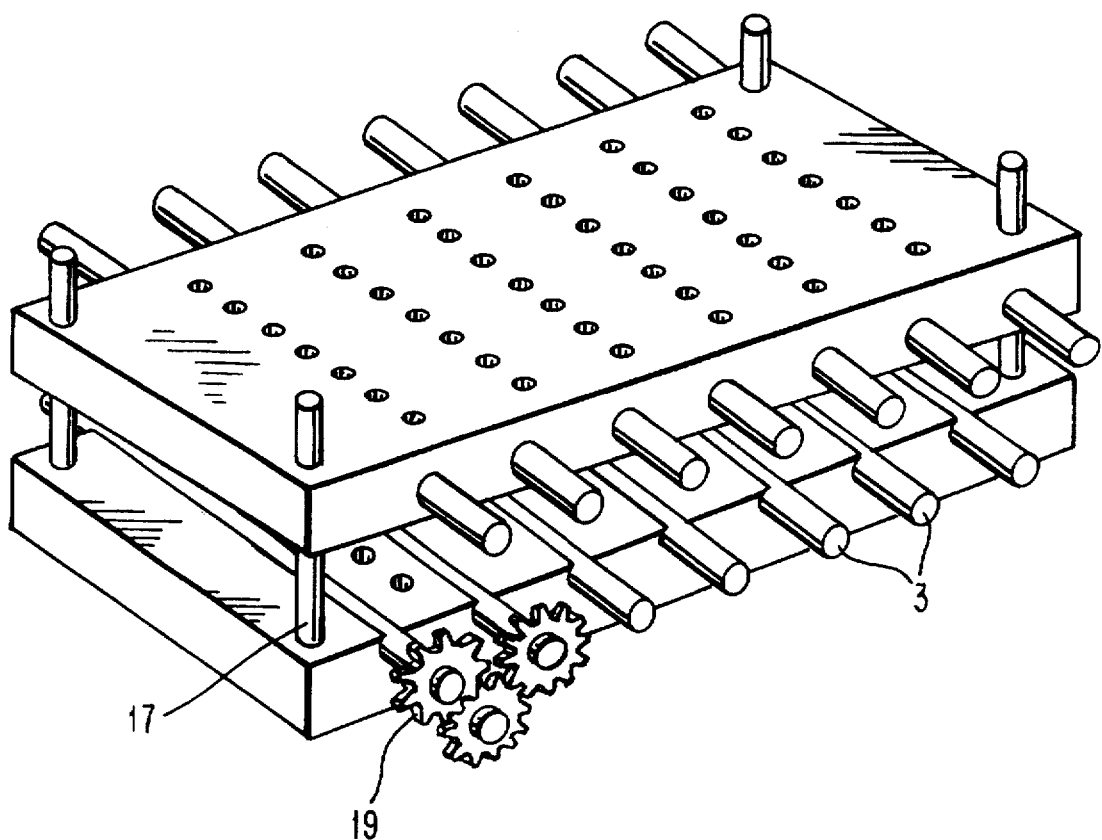
FIG. 2 represents a perspective view of another embodiment of a fluid head transport according to the present invention.

On the other hand, with some embodiments, all of the drive rod members of a particular plate may be driven, whether or not they are attached to a rotating apparatus. For example, the drive rod members may include gear members 19 as shown in FIG. 2. The gear members could be mounted on the ends of the drive rod members as in the embodiment shown in FIG. 2. The gear members could be any type of gear known to those skilled in the art.

Each of the drive rod members could be provided with a gear member. According to other embodiments, each drive rod member could include two gear members. In such an embodiment, each gear member would be connected to a gear on an adjacent drive rod member. Therefore, one gear would receive rotational energy from an adjacent upstream drive rod member and the other gear would transmit rotational energy to an adjacent downstream drive rod member.

According to other embodiments, the drive rod members may be connected with other apparatus. For example, the drive rod members could be connected with belts. Other suitable apparatus could also be used to transmit the rotational force between or among the drive rod members.

The drive rod members could be driven by any suitable drive mechanism. For example a simple electric motor could drive the drive rod members. In other embodiments, other drive mechanisms could be employed. In fact, any drive mechanism known to those skilled in the art could be used to rotate the drive rod members of the present invention.

An advantage of the drive rod members of the present invention is their relative simplicity as compared to known substrate transport mechanisms. The drive rod members are essentially the only moving part of the transport mechanism, other than apparatus to drive the rotation of the drive rod members. Accordingly, the drive rod members have few parts to make, assemble, maintain, and/or break down.

The drive rod members 3 are housed within a plurality of drive rod member receiving passages 7 provided in the plate 1. The surface of the drive rod member receiving passages acts as a bearing surface that the surface of the drive rod members rides upon. This relatively large bearing area makes the transport mechanism of the present invention particularly long lasting and resistant to wear.

The number of drive rod member receiving passages provided in any particular plate may depend, at least in part, upon the application. For example, when treating substrates having relatively little surface area, it may be desirable to have more drive rod members and, therefore, more drive rod member receiving passages, thereby helping to ensure that the substrate will be supported along substantially all of its length. On the other hand, the number of drive rod members and drive rod member receiving passages could be fewer if the substrates being treated are relatively large.

The spacing of the drive rod member receiving passages and, hence, the number of drive rod members, may also vary over the length of a plate. For example, the drive rod member receiving passages could be regularly spaced along the entire length of the plate. Alternatively, the drive rod member receiving passages could be clumped in groups. The spacing of the drive rod members and drive rod member receiving passages may also depend upon the application, and, in particular, the size of the substrate being treated. Preferably, the distance between the longitudinal axis of the drive rod members is less than the length of the substrate being treated so as to ensure that the substrate is always supported by the drive rod members.

The drive rod member receiving passages could be formed in a variety of ways. For example, the passages could be formed by drilling them in the plate. If the holes are drilled, then the drill could be positioned so as to create the opening 7a in the face of the plate 1. Alternatively, plate could be formed by molding, forging, or any other suitable process with the passages in place. These and other methods for the formation of the drive rod member receiving passages will be discussed in greater detail below.

The openings 7a provide a connection between the inside surface of the drive rod member receiving passages and the surface of the plate.

Regardless of how they are formed, the drive rod member receiving passages preferably have a substantially cylindrical cross section, at least adjacent to the portions of the cylindrical portions of the drive rod member that is located within a particular drive rod member receiving passage. Alternatively, the entire surface of a drive rod member receiving passage may be substantially uniform over substantially its entire surface. Similarly, the intersection between the drive rod member receiving passage and the surface of the plate may be a substantially straight line over substantially its entire length. Alternatively, the intersection may be a broken line or a series of linear segments, particularly if the surface of the drive rod member receiving passage is not uniform over its entire surface.

Preferably, regardless of how the drive rod member receiving passages are formed, a portion of the drive rod members less than one-half of the diameter of a drive rod will be exposed. It is this exposed portion that supports and transports the substrate. The exposed portion of the drive rod members may vary from a few mils up to just less than one-half of the diameter of the drive rod members. Alternatively, preferably, at least the intersection between the surface of the drive rod member receiving passages and the surface of the plate extends a distance greater than one-half of the diameter of the drive rod members.

The depth of the drive rod member receiving passages in relation to the surface of the plate mainly controls the amount of the drive rod members that is exposed. However, if the surface of the plate is not substantially planar, then the depth of the drive rod member receiving passages alone will not control the amount that the drive rod members are exposed. For example, the surface of the plate adjacent the drive rod member receiving passages may extend upwardly, above the surrounding surface of the plate and extend over the drove rod members more than if the surface of the plate were substantially planar over its entire surface. In typical embodiments, whether or not the surface of the plate extends upwardly, the drive rod members extend above the surface of the plate by about five to about thirty mils.

An advantage of the present invention is that the drive rod members may be exposed only to a small degree. Therefore, the substrate will encounter or "see" virtually a flat surface in the surface of the plate is substantially planar over its entire surface. An advantage of the substrate seeing a substantially flat surface of the transport mechanism is that very few places or obstacles exist that the substrate may be caught and hung up on.

Having a substrate "see" a substantially flat substrate may be particularly important when treating thin substrates. With typical fluid treatment apparatuses, the separation between the substrate and the fluid flow passages may be rather large. Often, the large separation allows the fluid flow to distort the substrate, causing the substrate to become entangled in the apparatus. This is particularly true when the substrate is supported a great distance from the surface of the support as well.

An additional advantage of reducing the distance that the drive rod members extend above the surface of the plate member is that with a reduced distance, the fluid may be more easily and efficiently confined to the surface of the substrate being treated. With greater distances separating the surface of the substrate and the surface of the plate, the fluid may more easily flow around and off of the substrate. If the fluid does not interact with the substrate, then the substrate will not be effectively treated. The problem of inadequate treatment of the substrate is exacerbated if the substrate includes any passages, such as through holes, vias, or others. With a narrow separation between the substrate and the treatment apparatus, the fluid is more likely to be forced into such passages. In part this is because the passages in the substrate can have a greater total cross sectional area than the area between the substrate and the plate.

With a greater separation, the inertia of the treatment fluid must be depended upon to cause the treatment fluid to flow into the passages in the substrate. The present invention helps to confine the treatment fluid to the substrate, forcing the fluid into the passages rather than between the substrate and the plate.

Another advantage of the present invention is that the transport mechanism, that is, the drive rod members, take up relatively little real estate of the surface area of the plate. One advantage of the relatively small area of real estate associated with the drive rod members is the greater area of real estate available for the fluid treatment portion of the device, such as fluid flow passages, for example fluid injectors and drains.

Therefore, one advantage of employing smaller diameter drive rod members is to minimize the real estate devoted to the transport mechanism. It follows that an additional advantage is more efficient and complete processing as a result of the increased number of fluid flow passages. However, the present invention offers and increased area for fluid flow passages as compared to known fluid treatment devices, whether the drive rod members are made with a smaller diameter or not.

The surface of the drive rod member receiving passages may be the same material that the plate is made of. Alternatively, if the plate is treated with another material, that material may form the surface of the drive rod member receiving passages. Furthermore, the surface of the drive rod member receiving passages may be coated with another material altogether. Such a material may be selected to enhance the performance of the rotation of the drive rod members. For example, the drive rod member receiving passages may be coated with a fluoropolymer, such as polytetrafluoroethylene (PTFE). One example of a PTFE is TEFLON. The material that the surface of the drive rod member receiving passages is coated or treated with may be selected based upon its ability to protect the plate from degradation resulting from exposure to the treatment fluid.

The diameter of the drive rod member receiving passages may vary, depending upon the application. Preferably, the diameter of the drive rod member receiving passages is only slightly greater than the diameter of the drive rod members. For example, the diameter of the drive rod members may be only about 0.002 inch greater than the diameter of the drive rod members. However, the diameter of the drive rod member receiving passages may vary from about 0.0005 inch to about 0.010 inch greater than the diameter of the drive rod members.

One advantage of having the diameter of the drive rod member receiving passages only slightly greater than the diameter of the drive rod members is that play will be reduced in the rotation of the drive rod members. Additionally, with little space existing between the drive rod members and the drive rod member receiving passages, a substrate is much less likely to be caught by a separation between the drive rod members and the drive rod member receiving passages. This advantage may become particularly significant when the invention is used to treat thin, flexible substrates. In such a case, the close fit will also help to prevent such thin, flexible substrates from wrapping around the drive rod members.

The drive rod member receiving passages may include apparatus for lubricating and/or cleaning the drive rod members. For example, drive rod member receiving passages could be provided that open on the surface of the passages. These lubricating passages could be provided connected to a source of a lubricating and/or cleaning substance. This substance may be the treatment fluid being used to treat the substrate. Alternatively, a source of a lubricating and/or cleaning substance could be provided near any opening leading to the space between the drive rod member and the drive rod member receiving passage, whether the space is in the vicinity of the side surface of the plate or the surface of the plate that the drive rod members protrude from. For instance, lubricating and/or cleaning substance could be provided near the openings 7a in the surface of the plate. In one embodiment, the drive rod members and drive rod member receiving passages could be fitted with trickle water or process compatible fluid lubrication. Any suitable apparatus could be used to provide the lubricating and/or cleaning substance to the drive rod members and drive rod member receiving passages.

The other function of the present invention, that of treating a substrate with a treatment fluid preferably is accomplished through a plurality of fluid flow passages 5 provided in the plate 1. The fluid flow passages 5 preferably are provided in the spaces in the plates between the drive rod members and the drive rod member receiving passages. The fluid flow passages may be formed between the upper and lower surface of the plates. Alternatively, the fluid flow passages may extend into the plate from the surface of the plate adjacent to the substrate being treated and then could be connected to other passage(s) formed in the plate parallel to the upper and lower surfaces of the plate. The passages may be formed in the plate, such as by drilling. Alternatively, the passages may be formed in the plate at the time that the plate is formed.

The fluid flow passages could he connected to a reservoir that covers surface of the plate at least in the vicinity of the fluid flow passages. Such a reservoir could include one opening that supplies all fluid flow passages simultaneously. Alternatively, the reservoir could include more than one opening that supplies the fluid flow passages. Any fluid reservoir known to those skilled in the art could be used to supply treatment fluid to the present invention.

The interior walls of the fluid flow passages may be the material forming the plate. Alternatively, another material may be applied to the interior surface of the fluid flow passages or the surface may be treated with another material(s). For example, the interior surface of the fluid flow passages may be treated and/or coated with a material the enhances the ability of the plate material to withstand the treatment fluid if the treatment fluid has any properties that cause it to degrade the plate material.

The fluid flow passages could also be treated and/or coated with a material that enhances the performance of any apparatus provided in the passages. For example, as described below, valves could be provided in the fluid flow passages. The movement of these valves could be enhanced by coating the surface of the passages with certain materials. For example, the passages may be coated with a fluoropolymer, such as polytetrafluoroethylene (PTFE). One example of a PTFE is TEFLON.

Any number of fluid flow passages may be provided in any pattern in the plate. For example, the fluid flow passages could be lined up in single rows between the drive rod members and drive rod member receiving passages as in the embodiments shown in FIGS. 1 and 2. Alternatively, the fluid flow passages could be staggered. However, any pattern of fluid flow passages producing the desired flow of treatment fluid could be used.

The fluid flow passages may be divided up between fluid injectors and drains. Accordingly, the pattern of fluid flow over the substrate could be altered by altering the arrangement of the function of the fluid passages in the plate. As described below, a device according to the invention may include a plate both above and below a substrate. The distribution of fluid flow passages provided in either plate may vary. In fact, the bottom place in some embodiments could include only drains, while the upper plate could include only fluid injector jets. Therefore, the arrangement of fluid flow passages in the both plates may affect flow of the treatment fluid. In addition, in an embodiment including stacked plates, only the drive rod members in the top plate may be driven, while the drive rod members in the bottom plate are not driven.

Figure 3:
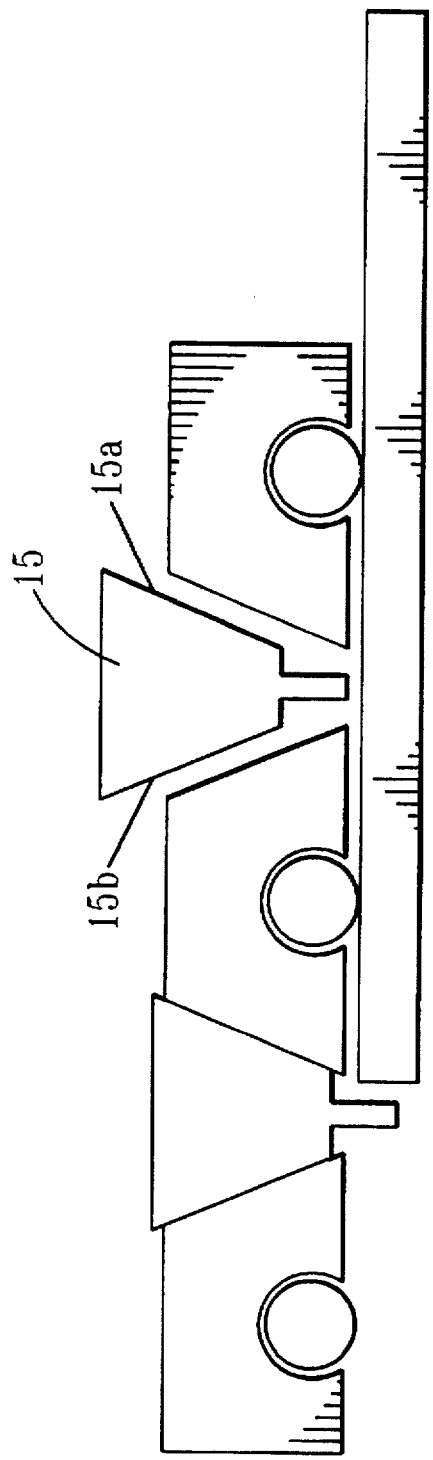
FIG. 3 represents a cross-sectional view of an further embodiment of a fluid head transport according to the present invention.

One arrangement of fluid flow passages provided in a plate according to the invention is shown in FIG. 3. According to this embodiment, the treatment fluid will pass only through fluid injectors and/or drains located over the substrate. This is accomplished by providing the passages with "poppet" valves 15 that direct flow only over an area of the substrate under the valves. These valves may permit a smaller pump to be utilized. In particular, a pump with a smaller fluid flow capacity may be utilized.

One embodiment of a poppet valve is shown in cross section in FIG. 3. The valve 15 preferably has slanted side walls 15a and 15b. The side walls may be angled at any angle as compared to the longitudinal axis of the valve. For example, the side walls of the valve may be angled from about 30° to about 60°. In one embodiment, the side walls of the poppet valves are angled at about 45°.

Preferably, the angle of the side walls of the passages in relation to a line parallel the longitudinal axis of the passages is about the same angle of the side wall of the valve. Accordingly, the angle of the side wall of the passages may be from about 35° to about 65°. In one embodiment, the size walls of the passages are angled at about 45°. Such an embodiment preferably includes the valves having the side walls that are angled at about 45°. Having the side walls of the valves and the valve receiving passages include substantially the same angle helps to ensure that when the valves are closed, the treatment fluid will not leak out very readily. The angled portion of the poppet valves may vary from about 0.0625 inch to about 0.25 inch in length.

The valve may have a circular cross section or another shape, such as square. The valves are activated by the substrates themselves. As the substrate encounters a poppet valve, the leading edge of the substrate forces the valve upwardly as shown in FIG. 3. As the valve is tilted and forced upwardly, the fluid is allowed to flow through the passage in the plate to the substrate.

As shown in FIG. 3, the valves preferably include a protuberance portion for engaging the substrate as the substrate passes under the valve. The protuberance portion may have any shape. For example, the protuberance portion may be angled so that the surface of the lower portion of the protuberance is further downstream than the upper portion of the protuberance. This configuration may help to cause the valve members to move upwardly in response to encountering the edge of the substrate. The length of the protuberance portion may be from about 0.0625 inch to about 0.025 inch.

FIG. 3 shows only one embodiment of a valve that may be used with a plate according to the present invention. Any other valve arrangements could also be used. For example, the valves could be substantially spherical. Such valves would be moved upwardly by the substrate passing underneath.

As shown in FIGS. 1 and 2, the present invention may include more than one plate. Preferably, the plates are oriented above and below a substrate being treated. The two plates may have substantially the same structure. Alternatively, the size of the plates, drive rod members, and/or other aspects of the plates and/or the location of the drive rod members, drive rod member receiving passages, and/or fluid flow passages may differ.

As shown in FIG. 2, the upper and lower plates may be joined with pins 17. The pins may be secured to the lower plate but simply pass through securing pin receiving passages provided in the upper plate. Other means may be provided for configuring the plates that allow the lower plate to be fixed and the upper plate to "float". Alternatively, both plates could be mounted to allow them to float. An advantage of floating plates is that the plates will self adjust for whatever thickness of substrate is being treated.

As the substrate is inserted between the plates for treatment, it will cause which ever plate is floating to move away from the opposite plate. Alternatively, if both plates float, then both plates may be moved away from each other to allow a substrate to pass. One or both of the plates in a two plate embodiment may be biased toward the other to allow the plates to move toward each other when a thinner plate is being treated, for example, the plates could be biased toward each other with one or more springs (not shown).

One advantage of the present invention is that is can treat thin substrates. The floating plates, drive rod members and drive rod member receiving passages help to accomplish this advantage. The floating plates, drive rod members, and drive rod member receiving passages help to do so by helping to decrease the distance separating the surface of the substrate and the surface of the plates.

In embodiments that include two plates, the drive rod members preferably are driven oppositely of each other. For example, the drive rod members on an upper plate that are driven may be driven in a counterclockwise direction and the drive rod members on a lower plate that are driven may be drive in a clockwise direction. Such a drive arrangement would result in the drive rod members in the embodiment shown in FIG. 2 transporting a substrate from the left of the embodiment to the right. However, the drive rod members may be rotated in any desired direction so as to transport a substrate in a desired direction.

In addition to including opposing plates, as in the embodiment shown in FIG. 2, the invention may include plates arranged side-by-side to accommodate wide substrates or to treat multiple substrates. Such side-to-side arrangements could utilize drive rod members that extend through all of the aligned drive rod member receiving passages. Also, multiple plates may be arranged end-to-end to process long substrates or to create an assembly line-type of operation. The plates may be arranged side-to-side and end-to-end. Also, the plates may be arranged side-to-side and end-to-end whether or not they are stacked as in FIG. 2. The side-by-side and/or end-to-end plates may or may not be secured together.

The invention also contemplates a plate for substrate treatment or transportation alone.

In preferred embodiments, a fluid treatment and transportation device according to the invention includes stacked plates such as the embodiments shown in FIGS. 4 and 5. The embodiment shown in these two figures includes an upper plate 20, a lower plate 22, a plurality of fluid flow passages 24, and drive rod members 26 arranged in drive rod member receiving passages 28. As shown in FIG. 4, the drive rod members may be in contact when the device is not treating a substrate. Having the drive rod members in contact may be preferable when the device is treating a thin substrate, such as a substrate as thin as a sheet of MYLAR.

FIG. 5 shows the embodiment shown in FIG. 4 with a substrate being treated. The substrate preferably forces the plates 20 and 22 apart.

The present invention also includes methods of forming a fluid treatment and/or transportation apparatus as described above. According to these methods, a plate of a desired material is provided. The plate may be formed from a desired material. Examples of materials include metals, metal alloys, plastics, composite materials. The plate may be treated with one or more other materials for a variety of purposes. Among these purposes are to protect the plate from wear and to protect the plate from a caustic or otherwise damaging treatment fluid, among others.

The plate may be substantially rigid or flexible to any degree. A flexible plate may be beneficial to allow the plate to more closely conform to the surface of the substrate being treated.

Preferably, the plate is provided as a piece of material of the desired size. Alternatively, a plurality of pieces may be used to form the plate. The pieces may be joined together to form the whole plate.

The drive rod receiving passages may be formed in the plate at the time it is formed. For example, the plate may be formed by introducing plastic, metal, or another material into a mold. On the other hand, the drive rod member receiving passages may be formed by drilling, such as with a drill bit, a laser, or other means. In embodiments where the drive rod receiving passages are formed after formation of the place, the passages could be formed in the plate such that the openings 7a in the plate are simultaneously formed. For example, a drill bit could be positioned so that the openings are formed as the drive rod receiving passages are drilled.

Alternatively, the drive rod receiving passages could be formed in the plate and then one of the surfaces of the plate could be removed until the passages are exposed to the desired degree and the openings 7a are formed in the desired size. As with the plate, the drive rod receiving passages could be treated with a material to enhance their performance, to protect them, or for another reason. For example, the drive rod member receiving passages may be coated with a fluoropolymer, such as polytetrafluoroethylene (PTFE). One example of a PTFE is TEFLON. The material that the surface of the drive rod member receiving passages is coated or treated with may be selected based upon its ability to protect the plate from degradation resulting from exposure to the treatment fluid.

As with the drive rod member receiving passages, the fluid flow passages may be either provided in the plates at the time that the place is formed or may be formed in the plate at a later time by drilling or other methods. The fluid flow passages may have a circular or other cross sectional shape. The size of the fluid flow passages may vary. The largest cross sectional dimension of the fluid flow passages may be from about 5 mils to about 40 mils. The cross sectional area of the fluid flow passages may vary from about 20 mils$^2$ to about 1256 mils$^2$. The shape, dimensions, and cross sectional area of the fluid flow passages may vary, depending upon a variety of factors. Among the factors are whether a particular fluid flow passage is a fluid injector or a drain and the desired flow rate of the treatment fluid through each fluid flow passage and/or the combined fluid flow passages.

As with the plate and the drive rod member receiving passages, the surface of the fluid flow passages may be treated with or coated with another material to enhance the functioning of or to protect the surface of the fluid flow passages. Valve members may be provided in the fluid flow passages after their formation. The passages and/or the valve members may be connected to a fluid source.

If the embodiment of the invention includes stacked plates, as in the embodiment shown in FIG. 2, then the lower plate could be provided with the mounting and guiding pins 17. The upper plate could be provided with mounting and guiding pin receiving passages. The passages could be formed at the time of the formation of the plate. Alternatively, the mounting and guiding pin receiving passages could be formed in the plate by drilling or other methods. Further, additional apparatus could be attached to one or both of the plates to mount and receive the mounting and guiding pins. The plates could hen be mounted adjacent to each other.

The drive rod members could be forged, molded, or formed in any other suitable manner. As described above, the drive rod members may be treated or coated with another material. The drive rod members could be mounted in the drive rod member receiving passages at any desired time. Also, the gears or other motion transfer mechanism could be attached to the drive rod members at any time. Alternatively, the motion transfer mechanism could be formed at the same time as the formation of the drive rod members, such as if the drive rod members were formed by introducing plastic, metal, or another material into a mold.

If the present invention includes multiple plates either side-by-side or end-to-end, the plates may be so arranged at any time. After arranging the plates, they may be secured together with any suitable means, such as pins, screws, adhesive. The plates may also be secured together with drive rod members that extend through drive rod member receiving passages in adjacent plates.

The present invention also includes methods of treating substrates. According to such methods, a treatment apparatus as described above may be provided. The drive rod members may then be rotated. A substrate may then be introduced into the treatment apparatus. A treatment fluid may be introduced into the fluid flow passages.

While the present invention has been described with respect to various preferred aspects thereof, it will be appreciated that the present invention can be implemented by those skilled in the art once aware of the present invention to suit particular requirements. It will be understood that various changes and substitutions may be made within the sphere and scope of the invention as defined in the following claims.

What is claimed is:

1. A fluid treatment apparatus, comprising:
   a lower substrate transportation and fluid head including a plurality of lower drive rod members provided in a plurality of spaced apart lower drive rod member receiving passages, said lower drive rod members at least partially extending through an upper surface of said lower substrate transportation and fluid head, a plurality of fluid injector passages and fluid drain passages being provided between said lower drive rod members;
   an upper substrate transportation and fluid head including a plurality of upper drive rod members provided in a plurality of spaced apart drive upper rod member receiving passages, said upper drive rod members at least partially extending through a lower surface of said upper substrate transportation and fluid head, a plurality of fluid injector passages and fluid drain passages being provided between said upper drive rod members;
   a plurality of valve members received by said fluid injector passages, wherein when said fluid treatment apparatus is treating a substrate, said substrate moving under said valve causes said valve to open, said valves being in a closed position when said substrate is not in contact with said valve members;
   a fluid supply apparatus for supplying fluid to said fluid injector passages; and
   a fluid source.

2. A fluid treatment apparatus according to claim 1, wherein each of said lower drive rod members has a substantially equal diameter to the others and extends above said upper surface of said lower substrate transportation and fluid head less than one-half of the diameter of said lower drive rod members.

3. A fluid treatment apparatus according to claim 1, wherein each of said upper drive rod members has a substantially equal diameter to the others and extends above said lower surface of said lower substrate transportation and fluid head less than one-half of the diameter of said upper drive rod members.

4. A fluid treatment apparatus according to claim 1, wherein said lower substrate transportation and fluid head is substantially stationary and said upper substrate transportation and fluid head is movable.

5. A fluid treatment apparatus according to claim 1, wherein said upper and lower drive rod members have a smaller diameter than a diameter of said upper and lower drive rod member receiving passages.

6. A fluid treatment apparatus according to claim 1, wherein said diameter of said upper and lower drive rod members is about 0.002 inch smaller than said diameter of said upper and lower drive rod member receiving passages.

7. A fluid treatment apparatus according to claim 1, further comprising a plurality of upper and lower substrate transportation and fluid heads, said upper substrate transportation and fluid heads being arranged end to end and said lower substrate transportation and fluid heads being arranged end to end.

8. A fluid treatment apparatus according to claim 7, wherein said upper substrate transportation and fluid heads are connected to each other and said lower substrate transportation and fluid heads are connected to each other.

9. A fluid treatment apparatus according to claim 7, wherein said upper substrate transportation and fluid heads are arranged in a straight line and said lower substrate transportation and fluid heads are arranged in a straight line.

10. A fluid treatment apparatus according to claim 1, wherein sprockets are provided on said upper and lower drive rod members and a drive mechanism for rotating said drive rod members is connected to said sprockets.

11. A fluid treatment apparatus according to claim 10, wherein said upper drive rod members are rotated by said drive mechanism in a counterclockwise direction and said lower drive rod members are rotated by said drive mechanism in a counterclockwise direction.

12. A fluid treatment apparatus according to claim 1, wherein said upper and lower substrate transportation and fluid heads are arranged such that said utter and lower drive rod members are in contact when said fluid treatment apparatus is not in use.

13. A fluid treatment apparatus according to claim 1, wherein said upper and lower substrate transportation and fluid heads are about six inches by about twenty-four inches by about one inch.

14. A fluid treatment apparatus according to claim 1, wherein axes of said upper drive rod member receiving member passages are separated by about four inches and axes of said upper drive rod member receiving member passages are separated by about four inches.

15. A fluid treatment apparatus according to claim 1, wherein said upper and lower drive rod members are about eight inches long.

16. A fluid treatment apparatus according to claim 1, wherein said upper and lower drive rod members are from about 0.125 inch to about 0.375 inch in diameter.

17. A fluid treatment apparatus according to claim 1, further comprising a lubricating apparatus for lubricating said drive rod members.

18. A fluid treatment apparatus according to claim 1, wherein when a substrate is being treated, said upper and lower surfaces of said upper and lower substrate transportation and fluid heads, respectively, and an upper and a lower surface of said substrate are separated by from about five mils to about thirty mils.

19. A fluid treatment apparatus, comprising:
   a lower substrate transportation and fluid head including
      a first sheet of material having an upper surface and a lower surface and two side surfaces interconnecting said upper surface to said lower surface,
      a plurality of spaced apart drive rod member receiving passages extending through said first sheet from one of said side surfaces to the other of said side surfaces and through said upper surface of said first sheet such that an inside surface of each of said drive rod member receiving passages is continuous with said upper surface of said first sheet and provides a bearing surface for a drive rod member inserted therein,
      a plurality of lower drive rod members provided in said drive rod member receiving passages such that said drive rod members are rotatably supported by said bearing surfaces and at least partially extend above said upper surface,
      at least one fluid injector passage and at least one fluid drain passage provided through said first sheet of material from said upper surface to said lower surface between said drive rod member receiving passages;

an upper substrate transportation and fluid head including
a second sheet of material having an upper surface and a lower surface and two side surfaces interconnecting said upper surface to said lower surface
a plurality of spaced apart drive rod member receiving passages extending through said second sheet from one of said side surfaces to the other of said side surfaces and through said lower surface of said second sheet such that an inside surface of each of said drive rod member receiving passages is continuous with said lower surface of said second sheet and provides a bearing surface for a drive rod member inserted therein,
a plurality of upper drive rod members provided in said drive rod member receiving passages such that said drive rod members are rotatably supported by said bearing surfaces and at least partially extend below said lower surface,
at least one fluid injector passage and at least one fluid drain passage provided through said second sheet of material from said upper surface to said lower surface between said drive rod member receiving passages.

20. The fluid treatment apparatus according to claim 19, wherein each of said lower drive rod members has a substantially equal diameter to the others and extends above said upper surface of said first sheet less than one-half of the diameter of said lower drive rod members, and each of said upper drive rod members has a substantially equal diameter to the others and extends below said lower surface of said second sheet less than one-half of the diameter of said lower drive rod members.

21. The fluid treatment apparatus according to claim 19, wherein said first sheet is substantially stationary and said second sheet is movable.

22. The fluid treatment apparatus according to claim 19, further comprising:
a plurality of first sheets, second sheets, drive rod member receiving passages, and drive rod members, wherein said first sheets and said second sheets are arranged end to end.

23. The fluid treatment apparatus according to claim 19, wherein said first sheet and said second sheet are arranged such that they are in contact when said fluid treatment apparatus is not in use.

24. The fluid treatment apparatus according to claim 19, further comprising:
a lubricating apparatus for lubricating said drive rod members.

25. The fluid treatment apparatus according to claim 19, wherein when a substrate is being treated, said upper and lower surfaces of said first sheet and said second sheet, respectively, and an upper and a lower surface of said substrate are separated by from about five mils to about thirty mils.

26. The fluid treatment apparatus according to claim 19, further comprising:
a plurality of valve members received by said fluid injector passages, wherein when said fluid treatment apparatus is treating a substrate, said substrate moving under said valve causes said valve to open, said valves being in a closed position when said substrate is not in contact with said valve members.

* * * * *